US008878369B2

(12) United States Patent
Chen et al.

(10) Patent No.: US 8,878,369 B2
(45) Date of Patent: Nov. 4, 2014

(54) LOW POWER/HIGH SPEED TSV INTERFACE DESIGN

(75) Inventors: Chung-Hui Chen, HsinChu (TW); Jaw-Juinn Horng, Hsinchu (TW); Shuo-Mao Chen, New Taipei (TW); Der-Chyang Yeh, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 177 days.

(21) Appl. No.: 13/546,024

(22) Filed: Jul. 11, 2012

(65) Prior Publication Data
US 2013/0043541 A1  Feb. 21, 2013

Related U.S. Application Data

(60) Provisional application No. 61/523,504, filed on Aug. 15, 2011.

(51) Int. Cl.
*H01L 23/48* (2006.01)
*H01L 23/52* (2006.01)
*H01L 29/40* (2006.01)
*H01L 25/065* (2006.01)
*H01L 23/14* (2006.01)
*H01L 23/498* (2006.01)

(52) U.S. Cl.
CPC ..... *H01L 25/0657* (2013.01); *H01L 2924/0002* (2013.01); *H01L 2225/06572* (2013.01); *H01L 23/147* (2013.01); *H01L 23/49827* (2013.01); *H01L 23/481* (2013.01)
USPC ............................ 257/777; 257/369; 257/774

(58) Field of Classification Search
CPC .............. H01L 23/481; H01L 2224/97; H01L 2225/06541
USPC .................................. 257/369, 686, 774, 777
See application file for complete search history.

(56) References Cited

U.S. PATENT DOCUMENTS

| | | | |
|---|---|---|---|
| 8,659,136 B2 * | 2/2014 | Youn et al. | 257/686 |
| 2006/0145301 A1 | 7/2006 | Saito et al. | |
| 2011/0074460 A1 * | 3/2011 | Ku | 326/21 |
| 2011/0291287 A1 | 12/2011 | Wu et al. | |
| 2012/0080802 A1 | 4/2012 | Cheng et al. | |
| 2013/0280863 A1 * | 10/2013 | Suh | 438/109 |

OTHER PUBLICATIONS

Katti, G. et al., "Through-Silicon-Via Capacitance Reduction Technique to Benefit 3-D IC Performance", IEEE Electron Device Letters, Jun. 2010, 31(6):549-551.

Katti, G. et al., "Temperature dependent electrical characteristics of Through-Si-Via (TSV) interconnections", 2010 International Interconnect Technology Conference (IITC): Jun. 2010, 3 pages.

\* cited by examiner

*Primary Examiner* — Thien F Tran
(74) *Attorney, Agent, or Firm* — Duane Morris LLP

(57) ABSTRACT

A TSV interface circuit for a TSV provided in an interposer substrate that forms a connection between a first die and a second die includes a driving circuit provided in the first die and a receiver circuit provided in the second die where the driving circuit is coupled to a first supply voltage and a second supply voltage that are both lower than the interposer substrate voltage that substantially reduces the parasitic capacitance of the TSV. The receiver circuit is also coupled to the first supply voltage and the second supply voltage that are both lower than the interposer substrate voltage.

17 Claims, 6 Drawing Sheets

P-substrate example

Nwell example
N=5

LOW POWER/HIGH SPEED TSV INTERFACE DESIGN

This application claims the benefit of priority of U.S. Provisional Patent Application No. 61/523,504, filed Aug. 15, 2011, which is expressly incorporated by reference herein in its entirety.

FIELD

The disclosed subject matter generally relates to through-substrate vias in 3D integrated circuits ("3D-ICs").

BACKGROUND

Through-substrate via ("TSV"), also known as through-silicon via, technology is an important enabler for 3-D integration of integrated circuits. A TSV is a vertical electrical connection passing completely through a substrate, such as a semiconductor wafer or a die and provide high performance packaging solution for creating 3D packages and 3D ICs. A TSV typically contains a high-aspect-ratio metal via embedded in silicon or other semiconductor substrate, also referred to as an interposer, and electrically isolated from the substrate by a layer of dielectric liner, usually an oxide, hence forming a metal-oxide-semiconductor structure. It is desirable to keep the parasitic capacitance introduced by TSV as low as possible for low latency signal transmission.

Figure 1A:
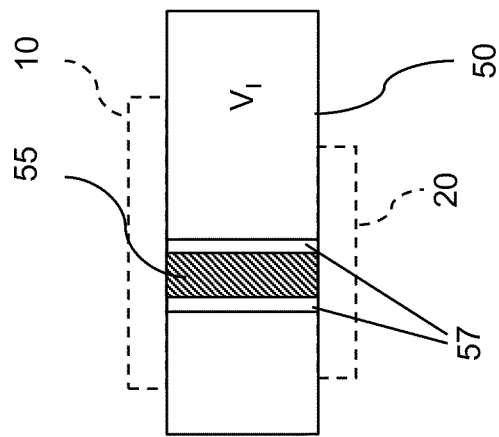
FIG. 1(a) shows a typical structure of a TSV.

All drawings are schematic and are not drawn to scale.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIG. 1(a) is a cross-sectional view of a typical structure of a TSV 55. The TSV 55 is a metallic conductor that extends through the thickness of an interposer 50 providing an electrical connection to IC devices on either side of the interposer 50. In this example, the TSV 55 provides an electrical connection between two IC dies 10 and 20. The interposer substrate 50 is generally formed from silicon or other semiconductor material. A layer of dielectric material 57 isolates the TSV 55 from the surrounding interposer substrate 50. The interposer substrate 50 is at a voltage $V_I$ that is generally at or close to 0 volts.

Figure 1B:
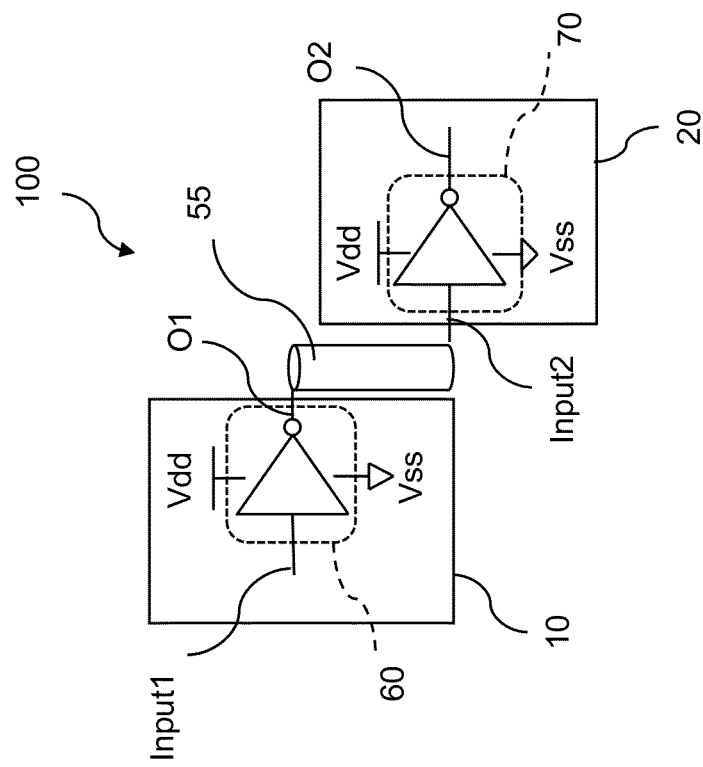
FIG. 1(b) shows an example of a TSV interface circuit according to an embodiment.

According to an embodiment of the present disclosure, FIG. 1(b) illustrate a TSV interface circuit 100 for a TSV 55 provided in an interposer substrate 50 that forms a connection between a first die 10 and a second die 20. The TSV interface circuit 100 comprises a driving circuit 60 provided in the first die 10. The driving circuit 60 comprises an input Input1 and an output O1 that is coupled to the TSV 55.

The driving circuit 60 is an inverter circuit coupled to a first supply voltage Vdd as its power and a second supply voltage Vss as its ground. According to an aspect of the present disclosure, unlike in the conventional TSV interface circuitry that operates at supply voltages equal to or higher than the interposer substrate, the first and second supply voltages Vdd and Vss are lower than the interposer substrate voltage $V_I$. The receiver circuit 70 provided in the second die 20 is also an inverter circuit coupled to the first supply voltage Vdd as its power and the second supply voltage Vss as its ground. Biasing the driving circuit 60 and the receiver circuit 70 with the first and second supply voltages that are lower than the interposer substrate voltage lowers the parasitic capacitance of the associated TSV by approximately 30%.

According to another embodiment, the improved TSV interface circuit can be implemented on a conventional TSV interface circuit by lowering the power and ground voltages for the TSV interface circuit using the existing power supply for the dies 10 and 20. The supply voltage from the existing power supply is designated herein as VDD. Then according to an aspect of the present disclosure, the first supply voltage Vdd for the driving circuit 60 and the receiver circuit 70 is −N*VDD and the second supply voltage Vss is −(N+1)*VDD, where N is any positive integer. In other words, $$Vdd = -N*VDD,$$

and $$Vss = -(N+1)*VDD.$$

where N is an integer from 1 to 10, and Vdd and Vss will be lower than $V_I$ which is 0 V.

According to another aspect, the TSV interface circuit 100 further comprises a receiver circuit 70 provided in the second die 20. The receiver circuit 70 comprises an output O2 and an input Input2 that is coupled to the through-substrate via 55. The receiver circuit 70 is coupled to the first supply voltage Vdd and the second supply voltage Vss.

Figure 2:
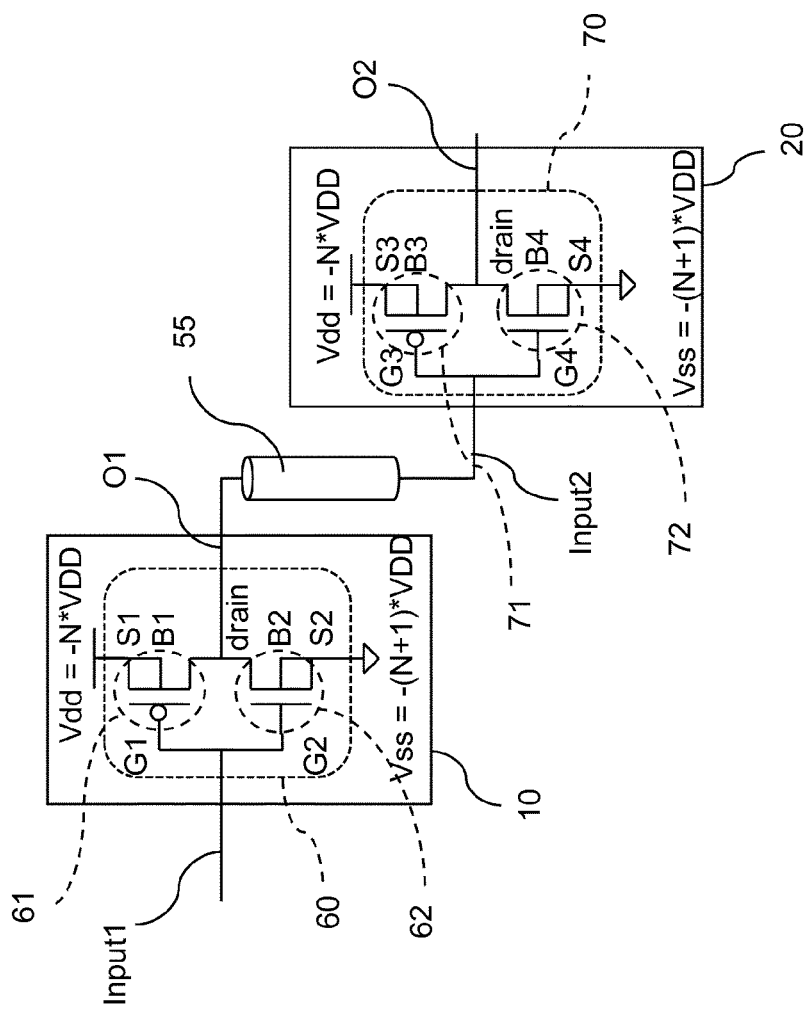
FIG. 2 shows an example of a TSV interface circuit where the TSV is provided in a p-type substrate.

Referring to FIG. 2, according to an aspect of the present disclosure, the driving circuit 60 is a CMOS inverter comprising a PMOS transistor 61 and an NMOS transistor 62 connected in parallel configuration between the input Input1 and the output O1. The PMOS transistor 61 comprises a gate terminal G1, a bulk terminal B1, and a source terminal S1. The NMOS transistor 62 comprises a gate terminal G2, a bulk terminal B2, and a source terminal S2 with a shared drain terminal. The PMOS transistor 61 and the NMOS transistor 62 have a shared drain. The PMOS transistor's bulk and source terminals B1, S1 are connected to the first supply voltage Vdd and the NMOS transistor's bulk and source terminals B2, S2 are connected to the second supply voltage Vss, where the Vdd and Vss are lower than the interposer substrate voltage $V_I$.

According to yet another aspect, the receiver circuit 70 is also a CMOS inverter comprising a PMOS transistor 71 and an NMOS transistor 72 connected in parallel configuration between the input Input2 and the output O2 of the receiver circuit. The PMOS transistor 71 comprises a gate terminal G3, a bulk terminal B3, and a source terminal S3. The NMOS transistor 72 comprises a gate terminal G4, a bulk terminal B4, and a source terminal S4. The PMOS transistor 71 and the NMOS transistor 72 have a shared drain. The PMOS transistor's bulk and source terminals B3, S3 are connected to the first supply voltage Vdd and the NMOS transistor's bulk and source terminals B4, S4 are connected to the second supply voltage Vss.

Figure 3:
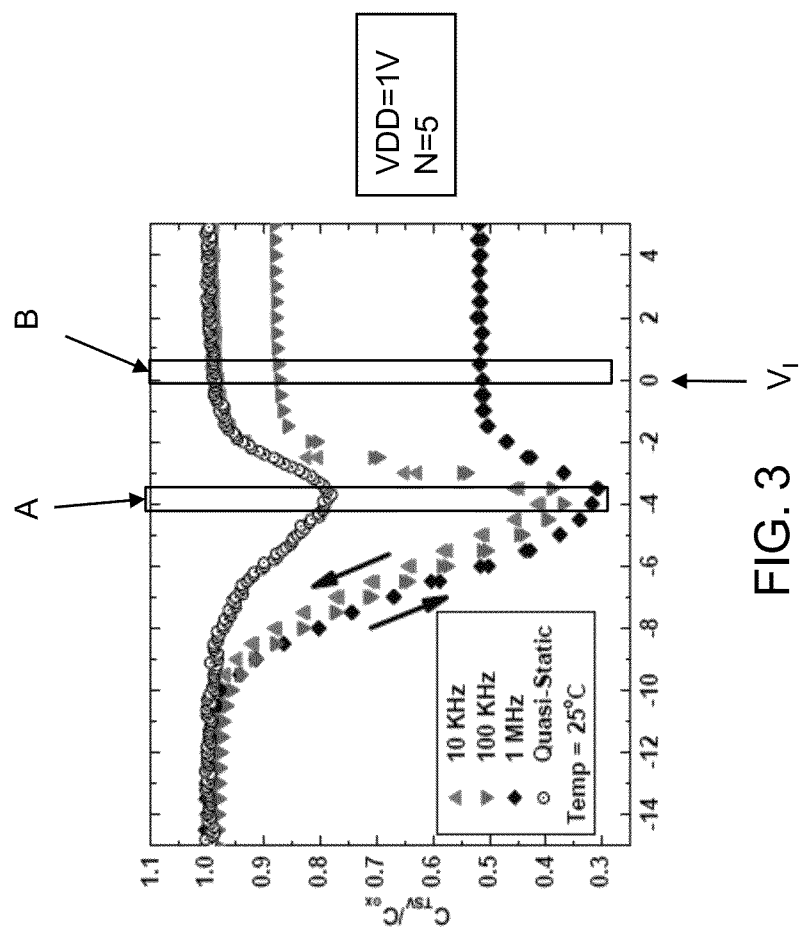
FIG. 3 is a TSV C-V characteristics plot with varying frequencies @ 25° C.

FIG. 3 is a TSV C-V characteristic plot with varying frequencies at 25° C. In this plot VDD is assumed to be 1V and N=5. The y-axis is (Capacitance of TSV ($C_{TSV}$))/(Capacitance of the Oxide dielectric layer ($C_{OX}$)). In various embodiments, the bias is selected so the TSV voltage is lower than the substrate voltage. In some embodiments, the bias is selected within the zone A, In zone A, the capacitance of the TSV is reduced by about 30% when the TSV voltage is about 4 volts lower than the substrate voltage. The conventional TSV interface circuits operate with the bias voltages about zero, and had substantially higher values of $C_{TSV}/C_{OX}$ at each frequency shown in FIG. 3. The TSV interface circuit 100 of the present disclosure operates with the bias voltages in the region A, that are lower than the interposer substrate voltage $V_I$.

The examples described above and shown in FIG. 2 are for an embodiment where the TSV is provided in a p-type interposer substrate and the TSV interface circuit 100 is biased with the first supply voltage Vdd and the second supply voltage Vss that are negative with respect to 0V.

For an embodiment where the TSV is provided in an Nwell, the TSV interface circuit 100 is biased with the first supply voltage Vdd and the second supply voltage Vss that are positive with respect to the 0V of the interposer substrate voltage $V_1$. In other words:

$$Vdd=N*VDD,$$

and $$Vss=(N+1)*VDD.$$

Figure 4:
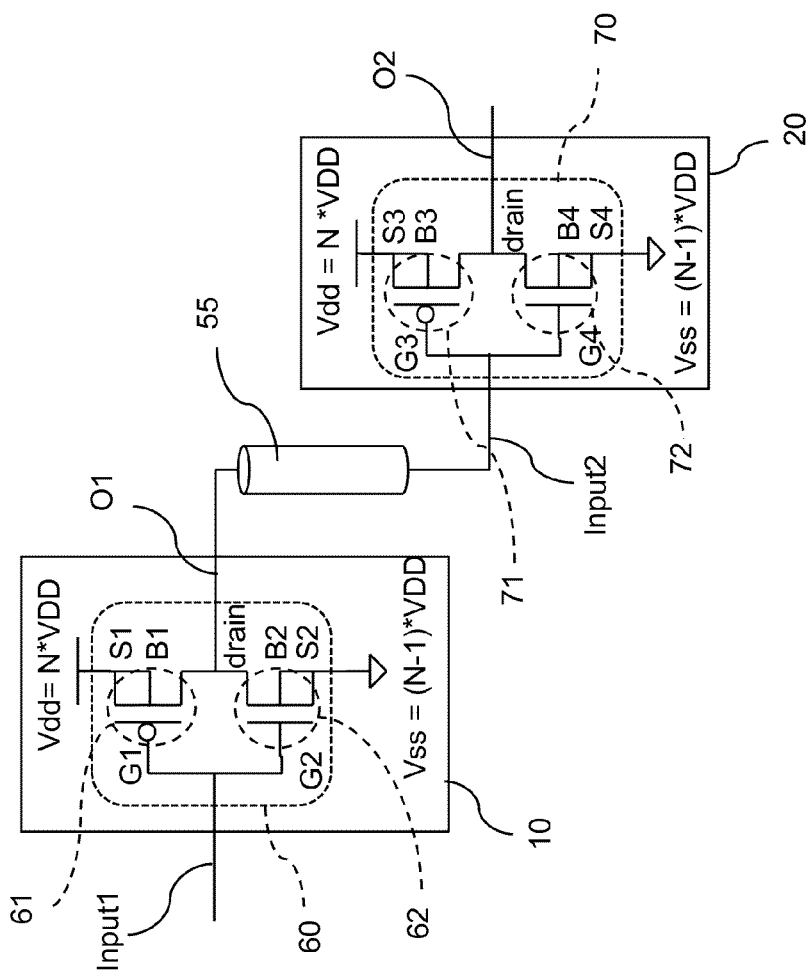
FIG. 4 shows another example of a TSV interface circuit where the TSV is provided in an Nwell.

This is illustrated in FIG. 4.

Figure 5:
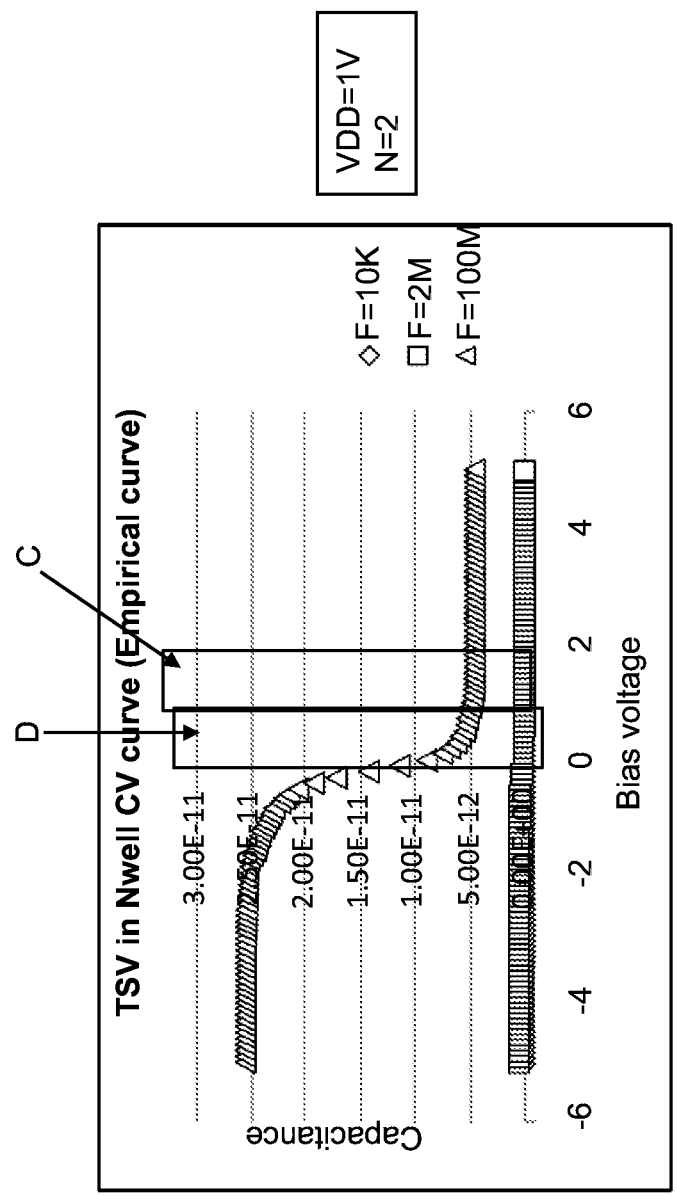
FIG. 5 is a C-V characteristic plot for a TSV in an Nwell.

Shown in FIG. 5 is a C-V characteristic plot of a TSV with varying frequencies (10 KHz, 100 KHz, 1 MHz and Quasi-Static) at 25° C. for an NWell example where VDD is 1V and N=2. The conventional TSV interface circuits would operate in the region D between 0V and 1V. The TSV interface circuit 100 of the present disclosure operates in region C at voltages higher than the interposer substrate voltage $V_I$. As shown in FIG. 5, when the TSV is surrounded by an Nwell, under a high bias voltage, the capacitance is lower.

In some embodiments, a level-down shifter is inserted before the TSV interface Tx and a level-up shifter is inserted after the TSV interface Rx.

Figures 6, 7:
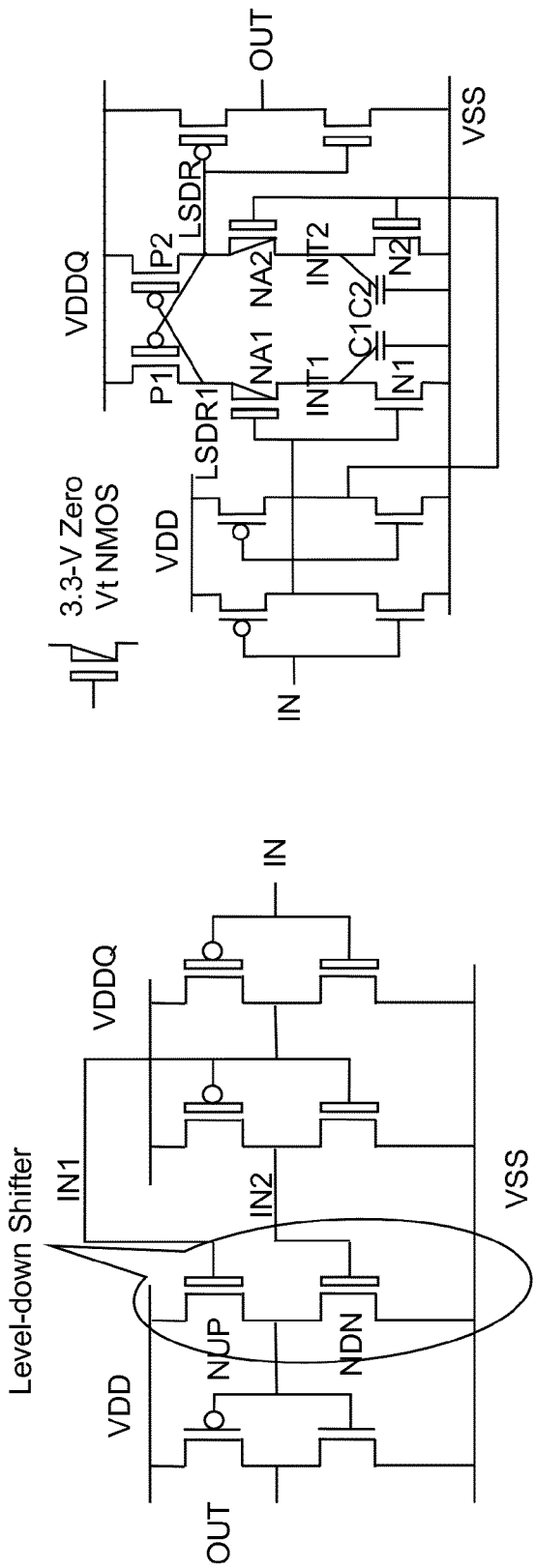
FIG. 6 is a schematic diagram of a level-down shifter to be placed before the TSV interface TX.
FIG. 7 is a schematic diagram of a level-up shifter to be placed after the TSV interface RX.

FIG. 6 is a schematic of a non-exclusive example of a suitable level-down shifter. IN1 and IN2 are 3.3-V signals, and VDD is at 1-V that makes pull-up and pulldown devices, NUP and NDN, to have large gate-to-source voltages and thus low resistance. Because NUP and NDN always work in linear region, this circuit can work without any minimum limitation of the core voltage. NUP and NDN are optimized with sizes 3-µm/0.35-µm and 3-µm/0.35-µm, respectively.

FIG. 7 is a schematic of a non-exclusive example of a suitable level-up shifter. Zero-Vt 3.3-V NMOSs NA1 and NA2 can be used to protect 1.0-V NMOSs N1 and N2 from high voltage stress. The gate of NA1 (NA2) is not fixed to VDD because INT1 (INT2) will approach VDD+BV where the gate voltage of NA1 (NA2) is at VDD and N1 (N2) is off that causes gate-oxide breakdown of N1 (N2). BV is the balanced voltage when the subthreshold leakage of NA1 (NA2) is equal to the junction reversed-bias leakages of NA1 plus N1 (NA2 plus N2). Turning off NA1 (NA2) when P1 (P2) pulls up can isolate the parasitic capacitance C1 (C2) from the node LSDR1 (LSDR) and thus increase speed.

These are only examples, and one or ordinary skill can readily substitute other suitable level-down and level-up shifters.

The TSV interface circuit disclosed herein lowers the parasitic TSV capacitance by about 30%. With the lower parasitic capacitance, the power consumption under the same operating speed and voltage can be about 5×~3× lower. Conversely, the speed under the same power and voltage can be 5×~3× faster.

Although the subject matter has been described in terms of exemplary embodiments, it is not limited thereto. Rather, the appended claims should be construed broadly, to include other variants and embodiments, which may be made by those skilled in the art.

What is claimed is:

1. A through-substrate via interface circuit for a through-substrate via provided in an interposer substrate that forms a connection between a first die and a second die, wherein the interposer substrate is at an interposer substrate voltage, VI, the through-substrate via interface circuit comprising:
    a driving circuit provided in the first die, the driving circuit having an input and an output that is coupled to the through-substrate via,
    wherein the driving circuit is coupled to a first supply voltage −N*VDD and a second supply voltage −(N+1)*VDD, wherein N is a positive integer, and
    wherein the first and second supply voltages are both lower than the interposer substrate voltage, VI.

2. The through-substrate via interface circuit of claim 1, wherein the driving circuit is a CMOS inverter comprising a PMOS transistor and an NMOS transistor connected in parallel configuration between the input and the output of the driving circuit,
    wherein each of the PMOS transistor and the NMOS transistor comprising a gate terminal, a bulk terminal, and a source terminal, and
    wherein the PMOS transistor's bulk and source terminals are connected to the first supply voltage −N*VDD and the NMOS transistor's bulk and source terminals are connected to the second supply voltage −(N+1)*VDD.

3. The through-substrate via interface circuit of claim 2, further wherein the interposer substrate voltage, VI is 0 V.

4. The through-substrate via interface circuit of claim 1, further comprising:
    a receiver circuit provided in the second die, the receiver circuit having an output and an input that is coupled to the through-substrate via,
    wherein the receiver circuit is coupled to the first supply voltage −N*VDD and the second supply voltage −(N+1)*VDD.

5. The through-substrate via interface circuit of claim 4, wherein the receiver circuit is a CMOS inverter comprising a PMOS transistor and an NMOS transistor connected in parallel configuration between the input and the output of the receiver circuit, wherein each of the PMOS transistor and the NMOS transistor comprising a gate terminal, a bulk terminal, and a source terminal, and wherein the PMOS transistor's bulk and source terminals are connected to the first supply voltage $-N*VDD$ and the NMOS transistor's bulk and source terminals are connected to the second supply voltage $-(N+1)*VDD$.

6. The through-substrate via interface circuit of claim 5, further wherein the interposer substrate voltage, VI is 0 V.

7. A through-substrate via interface circuit for a through-substrate via provided in an interposer substrate that forms a connection between a first die and a second die, wherein the interposer substrate is at an interposer substrate voltage, VI, the through-substrate via interface circuit comprising:

a receiver circuit provided in the first die, the receiver circuit having an output and an input that is coupled to the through-substrate via, wherein the receiver circuit is coupled to a first supply voltage $-N*VDD$ and a second supply voltage $-(N+1)*VDD$ to the receiver circuit, wherein N is a positive integer, and wherein the first and second supply voltages are both lower than the interposer substrate voltage, VI.

8. The through-substrate via interface circuit of claim 7, wherein the receiver circuit is a CMOS inverter comprising a PMOS transistor and an NMOS transistor connected in parallel configuration between the input and the output of the receiver circuit, wherein each of the PMOS transistor and the NMOS transistor comprising a gate terminal, a bulk terminal, and a source terminal, and wherein the PMOS transistor's bulk and source terminals are connected to the first supply voltage $-N*VDD$ and the NMOS transistor's bulk and source terminals are connected to the second supply voltage $-(N+1)*VDD$.

9. The through-substrate via interface circuit of claim 8, further wherein the interposer substrate voltage, VI is 0 V.

10. The through-substrate via interface circuit of claim 7, further comprising:

a driving circuit provided in the second die, the driving circuit having an output and an input that is coupled to the through-substrate via, wherein the driving circuit is coupled to the first supply voltage $-N*VDD$ and the second supply voltage $-(N+1)*VDD$ to the driving circuit.

11. The through-substrate via interface circuit of claim 10, wherein the driving circuit is a CMOS inverter comprising a PMOS transistor and an NMOS transistor connected in parallel configuration between the input and the output of the driving circuit, wherein each of the PMOS transistor and the NMOS transistor comprising a gate terminal, a bulk terminal, and a source terminal, and wherein the PMOS transistor's bulk and source terminals are connected to the first supply voltage $-N*VDD$ and the NMOS transistor's bulk and source terminals are connected to the second supply voltage $-(N+1)*VDD$.

12. The through-substrate via interface circuit of claim 11, further wherein the interposer substrate voltage, VI is 0 V.

13. A through-substrate via interface circuit for a through-substrate via provided in an interposer substrate that forms a connection between a first die and a second die, wherein the interposer substrate is at an interposer substrate voltage, VI, the through-substrate via interface circuit comprising:

a driving circuit provided in the first die, the driving circuit having an input and an output that is coupled to the through-substrate via, wherein the driving circuit is coupled to a first supply voltage $-N*VDD$ and a second supply voltage $-(N+1)*VDD$ to the driving circuit, wherein N is a positive integer, and wherein the first and second supply voltages are both lower than the interposer substrate voltage, VI; and a receiver circuit provided in the second die, the receiver circuit having an output and an input that is coupled to the through-substrate via, wherein the receiver circuit is coupled to the first supply voltage $-N*VDD$ and the second supply voltage $-(N+1)*VDD$ to the receiver circuit.

14. The through-substrate via interface circuit of claim 13, wherein the driving circuit is a CMOS inverter comprising a PMOS transistor and an NMOS transistor connected in parallel configuration between the input and the output of the driving circuit, wherein each of the PMOS transistor and the NMOS transistor comprising a gate terminal, a bulk terminal, and a source terminal, and wherein the PMOS transistor's bulk and source terminals are connected to the first supply voltage $-N*VDD$ and the NMOS transistor's bulk and source terminals are connected to the second supply voltage $-(N+1)*VDD$.

15. The through-substrate via interface circuit of claim 14, further wherein the interposer substrate voltage, VI is 0 V.

16. The through-substrate via interface circuit of claim 14, wherein the receiver circuit is a CMOS inverter comprising a PMOS transistor and an NMOS transistor connected in parallel configuration between the input and the output of the receiver circuit, wherein each of the PMOS transistor and the NMOS transistor comprising a gate terminal, a bulk terminal, and a source terminal, and wherein the PMOS transistor's bulk and source terminals are connected to the first supply voltage $-N*VDD$ and the NMOS transistor's bulk and source terminals are connected to the second supply voltage $-(N+1)*VDD$.

17. The through-substrate via interface circuit of claim 16, further wherein the interposer substrate voltage, VI is 0 V.

* * * * *

UNITED STATES PATENT AND TRADEMARK OFFICE
CERTIFICATE OF CORRECTION

PATENT NO. : 8,878,369 B2  
APPLICATION NO. : 13/546024  
DATED : November 4, 2014  
INVENTOR(S) : Chung-Hui Chen et al.

Page 1 of 1

It is certified that error appears in the above-identified patent and that said Letters Patent is hereby corrected as shown below:

IN THE CLAIMS:

Column 4, Claim 1, Lines 34 and 43, delete "VI" and insert -- $V_I$ --

Column 4, Claim 3, Line 57, delete "VI" and insert -- $V_I$ --

Column 5, Claim 6, Line 12, delete "VI" and insert -- $V_I$ --

Column 5, Claim 7, Lines 16 and 25, delete "VI" and insert -- $V_I$ --

Column 5, Claim 9, Line 39, delete "VI" and insert -- $V_I$ --

Column 6, Claim 12, Line 6, delete "VI" and insert -- $V_I$ --

Column 6, Claim 13, Lines 10 and 20, delete "VI" and insert -- $V_I$ --

Column 6, Claim 15, Line 40, delete "VI" and insert -- $V_I$ --

Column 6, Claim 17, Line 54, delete "VI" and insert -- $V_I$ --

Signed and Sealed this  
Twenty-third Day of February, 2016

Michelle K. Lee  
*Director of the United States Patent and Trademark Office*